(12) United States Patent
Chao et al.

(10) Patent No.: US 6,494,966 B2
(45) Date of Patent: Dec. 17, 2002

(54) METHOD OF MINIMIZING CONTAMINATING DEPOSITS USING DILUTE ACID RINSE

(75) Inventors: Virginia Chi-Chuen Chao, Essex Junction, VT (US); Scott A. Estes, Essex Junction, VT (US); Thomas B. Faure, Georgia, VT (US); Thomas M. Wagner, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/731,494

(22) Filed: Dec. 7, 2000

(65) Prior Publication Data

US 2001/0001958 A1 May 31, 2001

Related U.S. Application Data

(62) Division of application No. 09/178,209, filed on Oct. 23, 1998, now Pat. No. 6,162,565.

(51) Int. Cl.⁷ .............................. B08B 3/08; C23G 1/02
(52) U.S. Cl. ................... 134/26; 134/28; 134/3
(58) Field of Search ................. 134/3, 26, 27, 134/28

(56) References Cited

U.S. PATENT DOCUMENTS

| | | | | |
|---|---|---|---|---|
| 4,569,695 A | * | 2/1986 | Yamashita et al. | 134/1 |
| 4,670,365 A | | 6/1987 | Yoshihara | 430/5 |
| 4,759,823 A | * | 7/1988 | Asselanis et al. | 134/3 |
| 5,294,570 A | | 3/1994 | Fleming, Jr. et al. | 437/239 |
| 5,382,296 A | | 1/1995 | Anttila | 134/3 |
| 5,382,484 A | | 1/1995 | Hosno | 430/5 |
| 5,650,075 A | | 7/1997 | Hass et al. | 216/97 |
| 5,679,171 A | * | 10/1997 | Saga et al. | 134/3 |
| 5,810,940 A | * | 9/1998 | Fukazawa et al. | 134/3 |
| 5,972,794 A | | 10/1999 | Katakura | 438/704 |
| 6,099,662 A | * | 8/2000 | Wang et al. | 134/26 |
| 6,129,091 A | * | 10/2000 | Lee et al. | 134/3 |
| 6,146,467 A | * | 11/2000 | Takaishi et al. | 134/3 |

OTHER PUBLICATIONS

"Method and Chemicals for Mask–Cleaning Process" IBM Technical Disclosure Bulletin, vol. 33 No. 6B Nov., 1990. pp. 238–239.

* cited by examiner

Primary Examiner—Randy Gulakowski
Assistant Examiner—Saeed Chaudhry
(74) Attorney, Agent, or Firm—Howard J. Walter, Jr. Esq.; RatnerPrestia

(57) ABSTRACT

A method for removing contaminants from a substrate surface having a pattern formed on the surface. The method involves rinsing the substrate and pattern with water to remove acid reactive material. The substrate and pattern are then washed with an acid whose concentration is too low to attack the material that forms the pattern. Then the substrate is washed with water to remove the acid.

11 Claims, 4 Drawing Sheets

METHOD OF MINIMIZING CONTAMINATING DEPOSITS USING DILUTE ACID RINSE

This application is a divisional of U.S. patent application Ser. No. 09/178,209, filed on Oct. 23, 1998, now U.S. Pat. No. 6,162,565, issued on Dec. 19, 2000.

TECHNICAL FIELD

The present invention relates to the manufacture of photomasks and phase-shift masks. In particular, the invention relates to methods for forming chrome photomasks and for forming phase-shift masks without producing chrome opaque defects.

BACKGROUND OF THE INVENTION

A conventional photomask comprises a patterned light-shielding film of opaque material, typically a metal such as chromium, on a transparent mask substrate, typically silica (quartz). In photomask manufacture, a photoresist is applied to the opaque-material side of a mask blank comprising a layer of the opaque material on a transparent mask substrate. The photoresist is patterned by an image-wise exposure and wet developed to produce a pattern of photoresist over the opaque layer. The mask blank containing the imaged photoresist is either wet or dry etched to remove the opaque material revealed by removal of the photoresist. When the photoresist is stripped after etching, a patterned layer of opaque material remains on the transparent substrate.

Typically, a positive-tone, novolac-type photoresist is exposed by a laser tool and developed with TMAH: a dilute solution of tetramethyl ammonium hydroxide. TMAH developer is a strong base. The exposed portions of the opaque layer are wet etched with a ceric salt, typically ceric ammonium nitrate in 10% nitric acid or a ceric salt in 10% perchloric acid. An acidic solution of a ceric salt is a strong oxidizing agent.

When a wet etch is used, it is common practice to perform both the develop step and wet etch step sequentially in the same process chamber of the process tool. These steps are typically carried out using a spray process in which the developer and wet etchant are sequentially sprayed onto a rotating mask substrate in a single process chamber. The usual sequence is: develop, rinse with deionized water, wet etch, rinse with deionized water, and dry.

The ceric ion is soluble in the acidic etch solution. Basic ceric salts precipitate in neutral solution or in the basic developer solution, however, and form small particles across the entire mask blank. Over time, a steady build up of yellow ceric hydroxide particles, orange ceric ammonium nitrate particles, and mixtures of these cerium-containing particles forms and deposits throughout the process chamber. The nozzles that spray the rinse water also become contaminated with cerium. The rinse water contains cerium in both soluble and insoluble forms.

If a dry etch is used in place of a wet etch, the mask blank containing the patterned photoresist is developed with TMAH, washed with deionized water, dried, and transferred to a reactive ion etch system for the dry etch of the chrome layer. Although the dry etch does not use a cerium etchant, the process tool used to develop the photoresist is typically contaminated with cerium from other processing. Consequently, the mask blank is contaminated with cerium-containing particles during development. These particles are not removed by the deionized water rinse; rather, they produce chromium opaque defects on the resulting photomask due to micro-masking by the cerium-containing particles during dry etch of the chromium layer.

Most process tool manufacturers recommend a once-a-month manual washdown of the process tool with concentrated hydrochloric acid to remove the cerium compounds from the process tool. In addition to causing downtime, manual washdown is time consuming and inconvenient. Concentrated hydrochloric acid is corrosive and the precipitated cerium compounds and hydrochloric acid can react to produce chlorine gas and nitrogen dioxide.

Thus, a need exists for methods for removing precipitated particles of ceric salts from mask blanks prior to wet or dry etching to form photomasks and for methods for removing cerium deposits from process tools.

SUMMARY OF THE INVENTION

To meet this and other needs, and in view of its purposes, the present invention provides a method for forming a photomask on a mask blank having a transparent substrate and a chrome layer. When a dry etch is used to etch the chrome layer, the method comprises, in order, the steps of:
a) applying photoresist to the chrome layer of the mask blank, the mask blank either (i) having the chrome layer on the transparent substrate, or (ii) comprising, in order, the chrome layer, a phase-shift mask layer, and the transparent substrate;
b) patterning the photoresist;
c) wet developing the photoresist and removing a portion of the photoresist, revealing a portion of the underlying chrome layer;
d) rinsing the mask blank with water;
e) rinsing the mask blank with dilute acid;
f) rinsing the mask blank with water;
g) drying the mask blank;
h) dry etching the chrome layer and removing the portion of the chrome layer revealed in step c); and
i) stripping the photoresist from the mask blank.

When a wet etch is used to etch the chrome layer, the method comprises, in order, the steps of:
a) applying photoresist to the chrome layer of the mask blank, the mask blank either (i) having the chrome layer on the transparent substrate, or (ii) comprising, in order, the chrome layer, a phase-shift mask layer, and the transparent substrate;
b) patterning the photoresist;
c) wet developing the photoresist and removing a portion of the photoresist, revealing a portion of the underlying chrome layer;
d) rinsing the mask blank with water;
e) wet etching the chrome layer with an acidic solution of a ceric salt and removing the portion of the chrome layer revealed in step c);
f) rinsing the mask blank with water;
g) rinsing the mask blank with dilute acid;
h) rinsing the mask blank with water; and
i) stripping the photoresist from the mask blank.

The dilute acid does not attack the transparent substrate, the chrome layer, the phase-shift mask layer, or the photoresist, and cerium salts are soluble in the dilute acid. The dilute acid is preferably nitric acid or perchloric acid, more preferably nitric acid. The transparent substrate is preferably silica.

This method decreases the number of defects per photomask as well as the mask-to-mask variation in the number of defects. In addition, the acid rinse does not affect the photoresist so it is unnecessary to modify or change any other part of the overall process. The acid spray also prevents or removes the buildup of cerium-containing deposits in the process tool. This advantage reduces the number of times that the process tool must be cleaned to remove the buildup of cerium-containing deposits.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

Cerium-containing particles are thought to be formed by three different methods: (1) reaction of the basic TMAH developer with the acidic cerium wet etch to form a basic solution, causing cerium to precipitate out as cerium hydroxide; (2) dilution of the cerium wet etch with the deionized rinse water, causing cerium-containing precipitates to form; and (3) evaporation of the cerium wet etch from the chamber walls, leaving behind a powdery residue of cerium-containing precipitate. Although the present invention is not limited by any theory or mechanism, it is thought that the acid rinse reduces the number of defects on the photomask by: redissolving precipitated cerium particles on the mask blank; neutralizing any of the basic developer remaining on the surface of the mask blank, thus preventing formation of cerium-containing basic salt particles; and redissolving any cerium-containing particles present in the chamber, on the chamber walls, or on or in the nozzles or other structures.

A. Dry Etch of the Chrome Layer

Figure 1:
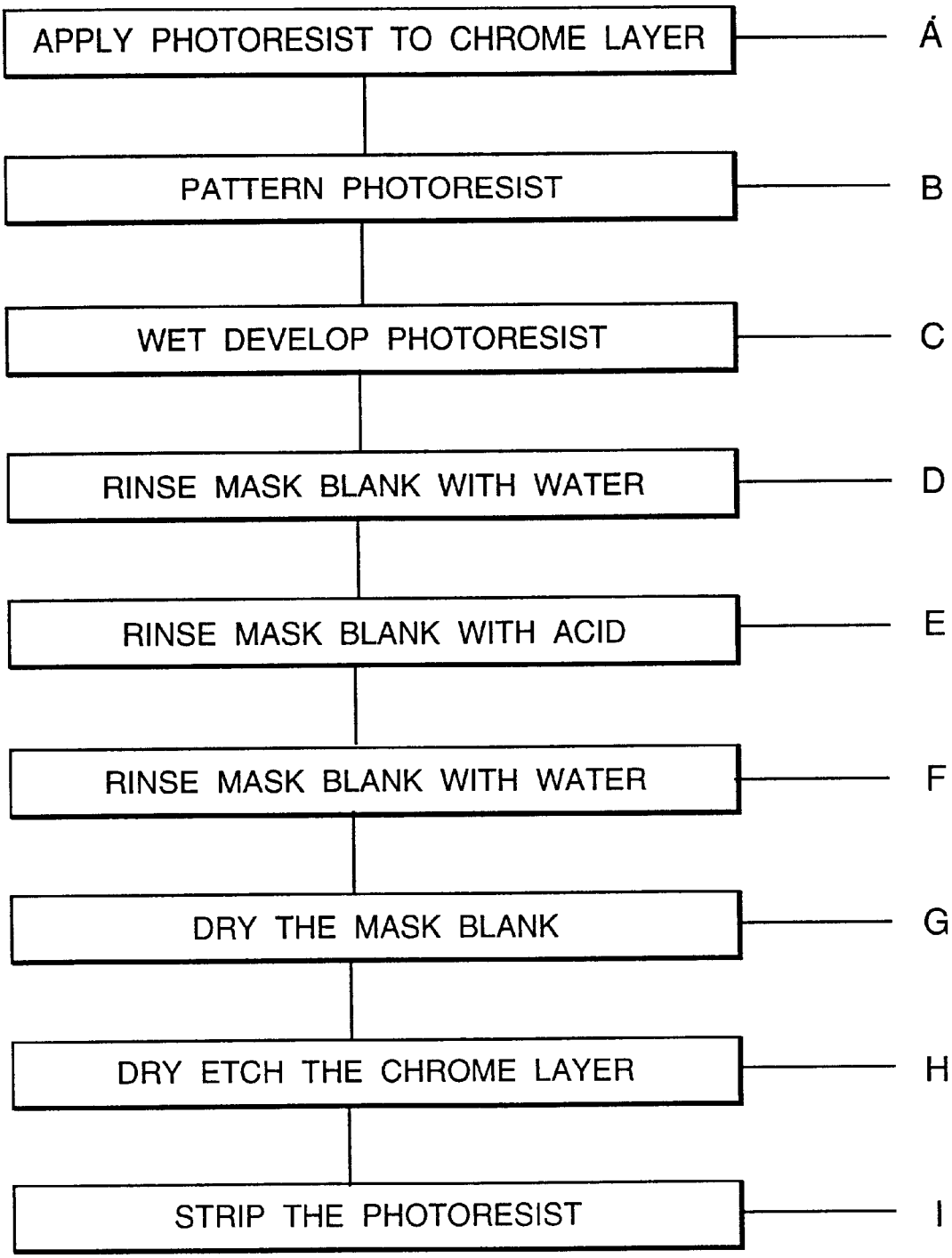
FIG. 1 is a block diagram showing the steps for producing a photomask using a first embodiment of the method of the present invention.

FIG. 1 shows, in block diagram form, the steps of a first embodiment of the method of the present invention in which the chrome layer is etched by a dry etch. In step A, a conventional photoresist, such as a novolac-resin photoresist, is applied to a mask blank. The mask blank comprises an opaque material on a transparent mask substrate. The mask substrate is typically highly polished, optically flat silica (quartz, $SiO_2$) about 90 mil, (about 0.23 cm) to 250 mil (about 0.64 cm) thick. The layer of opaque material is typically a uniformly sputtered layer of chromium and chromium oxide about 1050 Å thick, typically referred to as the chrome layer. The photoresist is typically applied to the opaque layer by conventional spin coating. The layer of photoresist is typically 5000 Å thick. Throughout the specification, the term "mask blank" may be used to refer to this structure, even though some processing may have been carried out on the mask blank.

In step B, the photoresist is patterned, i.e., image-wise exposed to produce a pattern of exposed and unexposed photoresist on the mask blank. The photoresist is typically patterned by a conventional direct-write technique, such as electron beam (e-beam) exposure or laser exposure at the i-line wavelength (365 nm).

In step C, the mask blank containing the patterned photoresist is wet developed by a conventional technique. Development removes the regions of the photoresist exposed in step B, revealing the underlying opaque material. Novolac photoresists are typically developed with an aqueous solution of TMAH or an aqueous base, typically aqueous potassium hydroxide. Processing is typically carried out in a process tool, such as those manufactured by Fairchild or by Steag.

In step D, the mask blank containing the patterned and developed photoresist is rinsed with water. Distilled or deionized water is preferred for the water rinse. The mp ask blank is typically rinsed for about 3 minutes to about 5 minutes at about 20° C. to about 25° C.

In step E, the mask blank containing the patterned and developed photoresist is rinsed with an aqueous solution of a dilute acid. The acid rinse is typically carried out for about 3 minutes to about 5 minutes at about 20° C. to about 25° C.

The dilute acid should not attack the silica substrate, the chrome layer, or the photoresist. If the acid attacks the photoresist, the photoresist image formed during the patterning step will be changed, changing the chrome pattern on the photomask. Cerium salts, especially basic cerium salts, must be soluble in the dilute acid. The acid must dissolve cerium-containing particles and deposits present in the process tool and, once in solution, cerium salts must not precipitate out of the acid.

Preferred acids are nitric acid and perchloric acid. Both cerium containing 10% (volume-to-volume) nitric acid and cerium containing 10% perchloric acid are used to etch chrome layers to form photomasks. Nitric acid is more Preferred.

Nitric acid that is about 1–30% volume-to-volume, preferably about 5–20% volume-to-volume, most preferably about 10% volume-to-volume (equivalent to 7 wt % nitric acid), may be used for the acid rinse. If the nitric acid solution is too concentrated, the photoresist will be attacked.

In step F, the mask blank containing the patterned and developed photoresist is again rinsed with water. Distilled or deionized water is preferred for the water rinse. The mask blank is typically rinsed for about 3 minutes to about 5 minutes at about 20° C. to about 25° C.

In step G, the mask blank containing the patterned and developed photoresist is dried. Drying is typically carried out by an on-center, high-speed spin. In preparation for the dry etch, the mask blank is spun at high speed in the process tool.

In step H, the mask blank containing the patterned and developed photoresist is dry etched. Dry etching is typically carried out by a reactive plasma ion etch using a mixture of chlorine and oxygen in the plasma. During etching, the chrome layer is removed from those regions of the mask blank from which the photoresist was removed by the patterning and developing steps, revealing the underlying chrome layer. In regions in which photoresist was not removed, the photoresist protects the underlying chrome layer and prevents its removal. A mask blank containing a chrome layer that has been etched in the same pattern as the photoresist is formed.

In step I, the photoresist is stripped to produce the photomask. When photoresist is stripped, a patterned layer of chrome, which corresponds to the pattern formed in the photoresist, remains on the silica substrate, forming the photomask. Typically, the photoresist is stripped with a solution containing one volume of 30% hydrogen peroxide to three volumes of concentrated sulfuric acid. Stripping is typically carried out at about 85° C. to about 100° C. for about 7 minutes to about 10 minutes.

After the photoresist is stripped from the photomask, the photomask typically undergoes a conventional defect inspection, line-width and dimensional check, and final inspection.

B. Wet Etch of the Chrome Layer

Figure 2:
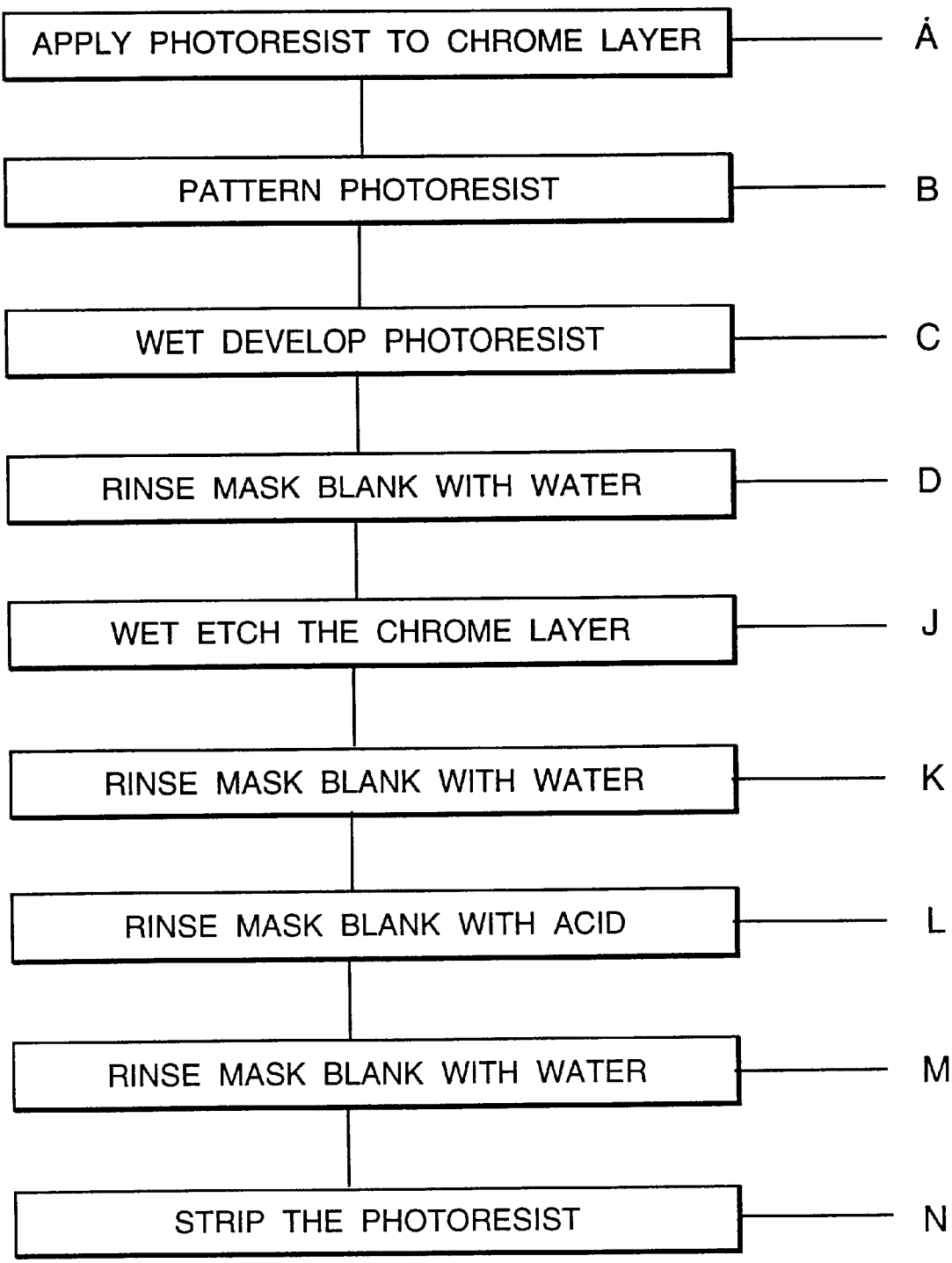
FIG. 2 is a block diagram showing the steps for producing a photomask using a second embodiment of the method of the present invention.

FIG. 2 shows, in block diagram form, the steps of a second embodiment of the method of the present invention in which the chrome layer is etched by a wet etch. Steps A–D are described above. A mask blank with a patterned and developed photoresist is produced by steps A–D. Although the acid rinse described in step E is not required at this point, because ceric ion is soluble in the acidic etch solution, an acid rinse as described in step E may be carried out, if desired. If the acid rinse is carried out, a water rinse is not required, before wet etch, because the wet etch is carried out in acid solution. If desired, however, a water rinse as described in step F may be carried out.

In step J, the mask blank is wet etched with a ceric salt, typically ceric ammonium nitrate in 10% nitric acid or a cerium salt in 10% perchloric acid. Etching is typically carried out at about 20° C. to about 25° C. for about 1 minute to about 2 minutes. The wet etch removes the revealed portions of the chrome layer. A mask blank containing a chrome layer that has been etched in the same pattern as the photoresist is formed.

In step K, the mask blank containing the etched chrome layer and the patterned and developed photoresist is rinsed with water. The mask blank is typically rinsed for about 3 minutes to about 5 minutes at about 20° C. to about 25° C.

In step L, the mask blank is rinsed with a dilute aqueous acid as described in step E. With 10% nitric acid, the acid rinse is typically carried out for about 3 minutes to about 5 minutes at about 20° C. to about 25° C.

In step M, the mask blank is again rinsed with water as described above. The mask blank is typically dried following the final rise so that water is not added to the concentrated sulfuric acid used to strip the photoresist. Drying is typically carried out by an on-center, high-speed spin.

In step N, the photoresist is stripped from the mask blank containing the patterned chrome layer to form the photomask. The photoresist may be stripped as described in step I above.

C. Preparation of Phase-Shift Masks

In another embodiment, the invention is a method for preparing a phase-shift mask. The compositions of mask blanks used to form a phase-shift mask are well known to those skilled in the art. The mask blank comprises, in order, an opaque layer, typically a chrome layer; a phase-shift mask layer; and a transparent substrate, typically highly polished, optically flat silica (quartz, $SiO_2$) about 90 mil (about 0.23 cm) to 250 mil (about 0.64 cm) thick. The phase-shift mask layer comprises a metal compound, typically molybdenum silicide (MoSi).

Figure 3:
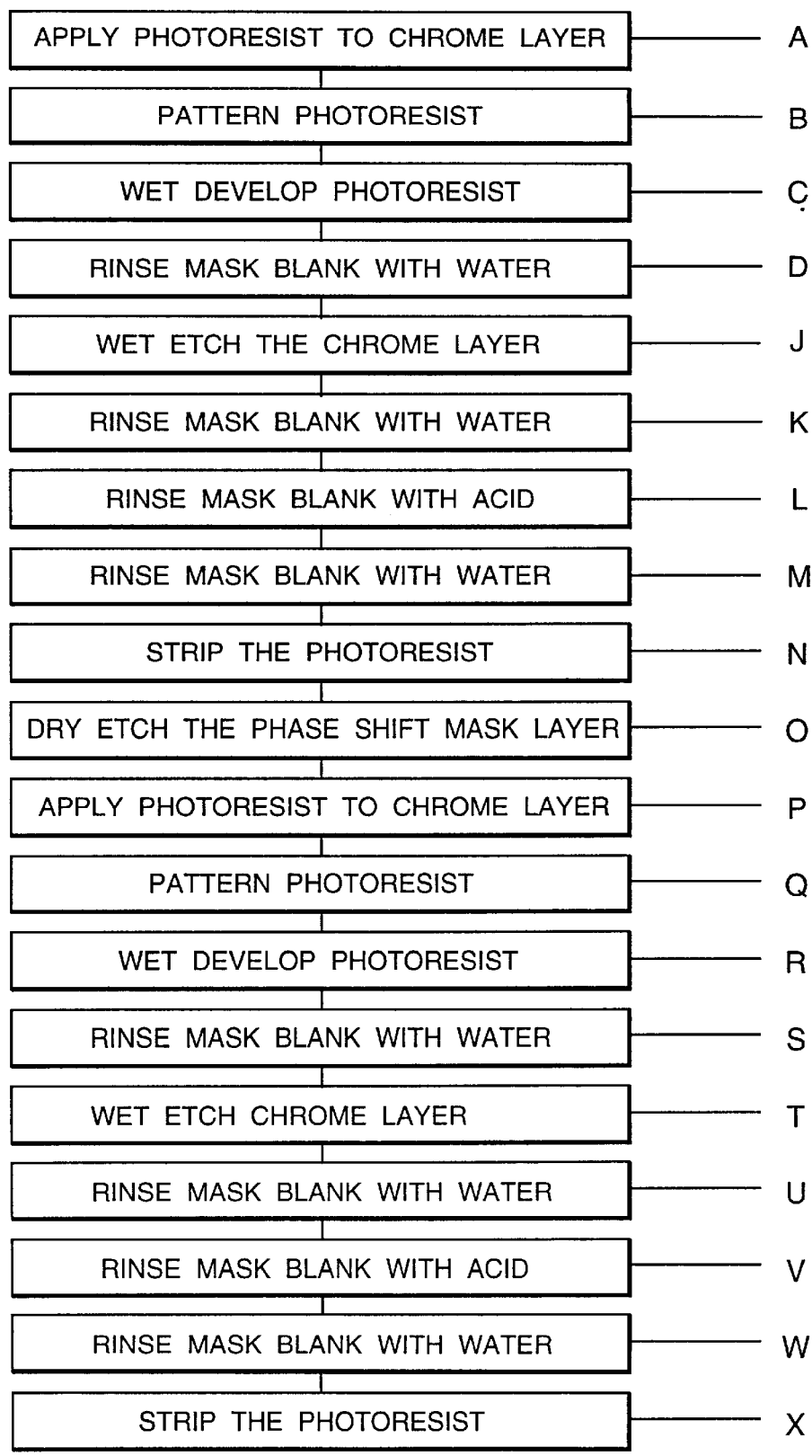
FIG. 3 is a block diagram showing the steps for producing a phase-shift mask using another embodiment of the method of the present invention.

FIG. 3 shows, in block diagram form, the steps of an alternate embodiment of the method of the present invention in which a phase-shift mask is formed. In this embodiment, the chrome layer is etched by a wet etch in step J. Steps A–D and J–N in this method are the same as described in FIG. 2, above, except that a mask blank containing a phase-shift layer between the chrome layer and the transparent substrate is used.

In step O, the mask blank containing the patterned and etched chrome layer is dry etched. Dry etching is typically carried out by a reactive plasma ion etch using a fluorine-containing compound such as carbon tetrafluoride or sulfur hexafluoride. During etching, the phase-shift mask layer is removed from those regions of the mask blank from which the chrome layer was removed by the patterning and developing steps, revealing the underlying phase-shift mask layer. In regions in which the chrome layer was not removed, the chrome layer protects the underlying phase-shift mask layer and prevents its removal.

In step P, a conventional photoresist is applied to the mask blank as in step A above. The photoresist is applied to the patterned and etched chrome layer. In step Q, the photoresist is patterned as in step B. In step R, the photoresist is wet developed as in step C. In step S, the photoresist is rinsed with water as in step D. Although the acid rinse described in step E is not required at this point, an acid rinse as described in step E may be carried out, if desired. If the acid rinse is carried out, a water rinse is not required before wet etch. If desired, however, a water rinse as described in step F may be carried out.

In step T, the chrome layer is wet etched, as in step J. In step U, the mask blank is rinsed with water as in step K. In step V, the mask blank is rinsed with acid as in step L. In step W, the mask blank is rinsed with water as in step M. If desired, the mask blank may be dried by an on-center, high-speed spin after step W and before step X. In step X, the photoresist is stripped from the mask blank, as in step N, to form the phase-shift mask.

Figure 4:
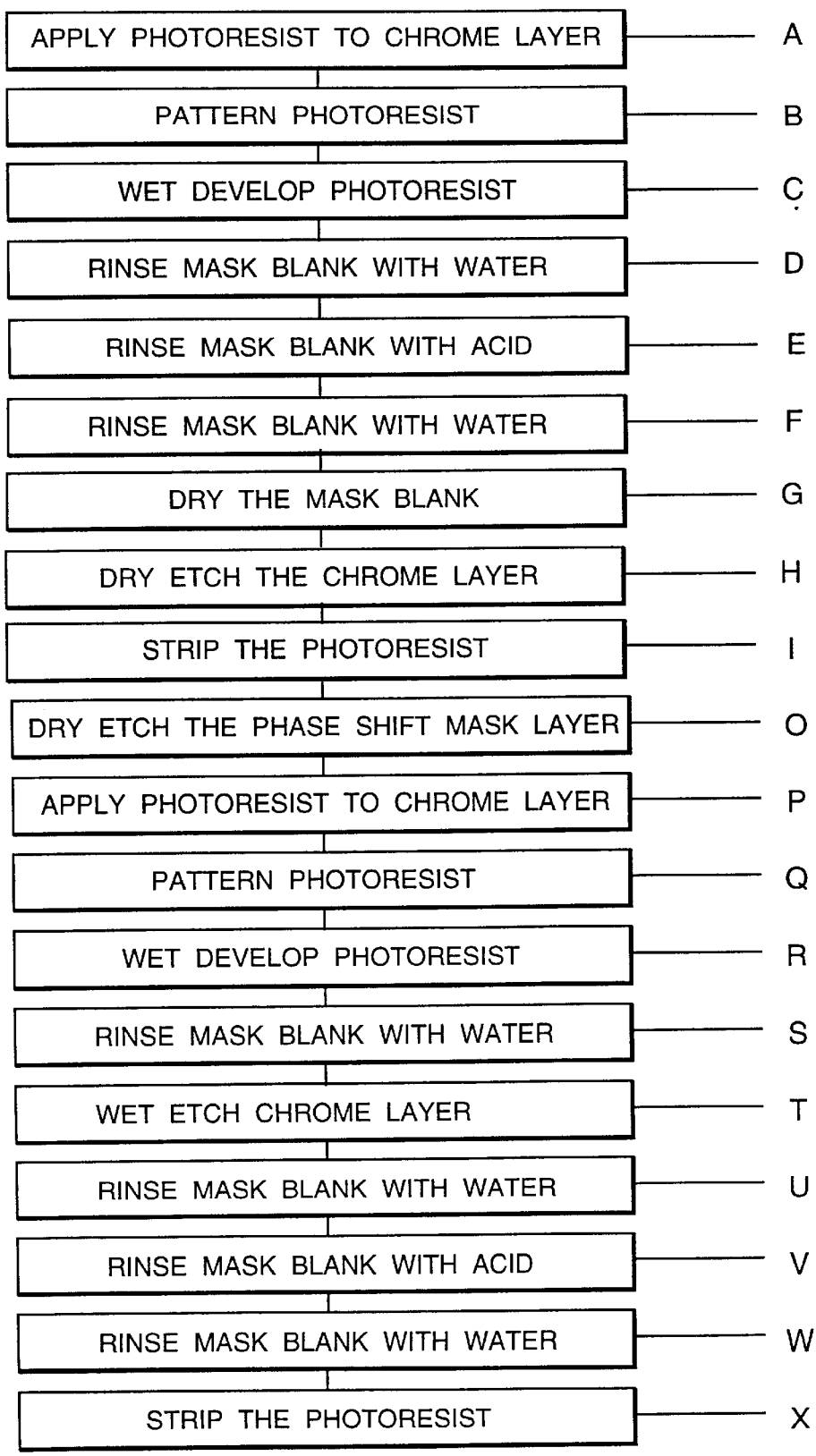
FIG. 4 is a block diagram showing the steps for producing a phase-shift mask using still another embodiment of the method of the present invention.

FIG. 4 shows, in block diagram form, the steps of an alternate embodiment of the method of the present invention in which a phase-shift mask is formed. In this method, the chrome layer is etched by a dry etch in step H. Steps A–I in this method are the same as described in FIG. 1, above, except that a mask blank containing a phase-shift layer between the chrome layer and the transparent substrate is used. Steps O–X are the same as described in FIG. 3, above.

D. Prevention and Removal of Cerium-Containing Deposits

According to yet another embodiment of the present invention, a method is provided for reducing or preventing the buildup of cerium-containing particles and deposits in a process tool. The process tool comprises a chamber as well as a set of process nozzles and a set of chamber and bowl rinse nozzles. The process nozzles direct the spray at the sample being processed, which is attached to a spindle in the center of the chamber. The chamber and bowl rinse nozzles direct the spray at the chamber walls, rather than at the sample.

Process tool manufacturers recommend spraying concentrated hydrochloric acid through the chamber and bowl rinse nozzles about once a month to remove the cerium compounds from the process tool. Concentrated hydrochloric acid is corrosive and can attack the process tool. The precipitated cerium compounds and hydrochloric acid can react to produce chlorine gas and nitrogen dioxide.

A periodic acid spray through the chamber and bowl rinse nozzles prevents or removes the buildup of cerium-containing deposits in the process tool, reducing the number of times that the process tool must be cleaned. The dilute acid must not attack the process tool, and cerium salts must be soluble in the dilute acid. These acids are described in step E, above. The acid is typically sprayed for about 3 minutes to about 5 minutes at about 20° C. to about 25° C.

The acid spray is followed by a water rinse. Water is typically sprayed about 3 minutes to about 5 minutes at about 20° C. to about 25° C. Distilled or deionized water is preferred for the water rinse.

For best results in preventing the buildup of cerium-containing deposits, the periodic acid spray and water rinse should be completed at least once per day. If desired, the method may be conveniently carried out at the end of each shift, i.e, three times per day.

E. Industrial Applicability

The present invention is a method for forming photomasks that are used in the patterning of semiconductor wafers. Semiconductor wafers are used in the manufacture of various semiconductor devices, such as integrated circuits, which are used, for example, in digital computers. The advantageous properties of this invention can be observed by reference to the following example which illustrates, but does not limit, the invention.

EXAMPLE

Control Example

Bare chromium monitor plates (mask blanks without photoresist) were measured for initial particle levels using a KLA Starlight tool. The plates were run through a develop, deionized water rinse, and dry process sequence in a develop/wet etch process tool, and the particle level remeasured. All reagents were sprayed through the process nozzles in this process sequence. The process tool contained a high level of cerium-containing deposits and particles because it had been used for a considerable time to carry out conventional processing and had not been cleaned.

So many particles were found after processing that the KLA Starlight tool was saturated (>10,000 particles) and aborted the inspection. Subsequent characterization of the particles by energy dispersive X-ray analysis showed that most of the particles contained cerium.

Example 1

The procedure of the Control Example was repeated using bare chromium monitor plates, except that a process sequence consisting of develop, deionized water rinse, nitric acid rinse with 10% nitric acid, deionized water rinse, and dry was carried out. All reagents were sprayed through the process nozzles in this process sequence. Surface particle counts were taken before and after processing. Only 96 particles were added by the develop process.

Example 2

Mask blanks containing photoresist were patterned and developed (1) by the conventional process, and (2) by a process that included a nitric acid rinse and a water rinse after the wet development and water rinse steps. Scanning electron microscope (SEM) studies of the developed photoresists were carried out prior to the etch step. SEM showed no difference in the developed photoresist image size and no difference in the developed photoresist sidewall. No change in exposure conditions or development time was required to obtain nominal image size when development was followed by a nitric acid rinse and a water rinse.

Example 3

A process sequence consisting of: develop with TMAH, deionized water rinse, wet etch with ceric ammonium nitrate in 10% nitric acid, deionized water rinse, rinse with 10% nitric acid, deionized water rinse, and dry, was carried out for three weeks. 895I novolac photoresist (OCG Microelectronics) was used as the photoresist.

The hard opaque defect levels on the photomasks produced during this period were compared with the defect levels on the photomasks produced during the previous three weeks, in which the nitric acid rinse had been omitted. With the nitric acid rinse, the average number of hard opaque defects requiring repair per photomask was reduced by a factor of three and the one sigma of plate-to-plate variation in hard opaque defects was reduced by almost a factor of 10.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method of removing contaminants from a substrate surface having a pattern formed thereon from a chrome layer that is attacked by acids above a respective known acid concentration level, the method comprising the steps of:

a) rinsing the substrate and the patterned chrome layer in water and removing acid reactive materials from the substrate and the pattern material;

b) rinsing the substrate and the patterned chrome layer in an acid having an acid concentration below the respective known acid concentration level and dissolving contaminants on the substrate surface; and c) rinsing the substrate and the patterned chrome layer in water and removing the acid.

2. The method of claim 1 in which the substrate is silica.

3. The method of claim 2 in which the acid is nitric acid or perchloric acid.

4. The method of claim 3 in which the contaminants comprise cerium salts.

5. The method of claim 4 in which the acid is about 1–30% volume-to-volume nitric acid.

6. The method of claim 1 in which the acid is nitric acid or perchloric acid.

7. The method of claim 1 in which the contaminants comprise cerium salts.

8. The method of claim 7 in which the acid is about 1–30% volume-to-volume nitric acid.

9. The method of claim 1 in which the acid is about 1–30% volume-to-volume nitric acid.

10. The method of claim 1 in which the acid is about 5–25% volume-to-volume nitric acid.

11. The method of claim 10 in which the contaminants comprise cerium salts.

* * * * *